United States Patent [19]

Sechan

[11] 4,103,106
[45] Jul. 25, 1978

[54] MOBILE RADIOTELEPHONE APPARATUS AND METHOD

[76] Inventor: Charles J. Sechan, 814 Grandview Ave., Pittsburgh, Pa. 15211

[21] Appl. No.: 722,772

[22] Filed: Sep. 13, 1976

[51] Int. Cl.² .......................... H04Q 7/04; H04B 7/26
[52] U.S. Cl. .................................................. 179/2 EB
[58] Field of Search ............... 179/41 A, 2 EA, 2 EB, 179/2 E; 325/53

[56] References Cited

U.S. PATENT DOCUMENTS

| 2,803,744 | 8/1957 | Berger | 325/55 |
|---|---|---|---|
| 3,173,996 | 3/1965 | Rypinski | 179/41 A |
| 3,351,714 | 11/1967 | Kunzelman | 179/41 A |
| 3,513,264 | 5/1970 | Baer | 179/41 A |
| 3,555,424 | 1/1971 | Malm | 325/53 |
| 3,634,627 | 1/1972 | Valentini | 179/15 BA |
| 3,764,915 | 10/1973 | Cox | 325/53 |
| 3,806,804 | 4/1974 | Mills | 325/55 |
| 3,894,194 | 7/1975 | Frost | 179/41 A |

Primary Examiner—Kathleen H. Claffy
Assistant Examiner—Kenneth A. Chayt
Attorney, Agent, or Firm—Arnold B. Silverman

[57] ABSTRACT

Mobile radiotelephone apparatus including channel finding means for locating an available channel for placing a call from the mobile unit. The channel finding means may have means for cyclically reducing one of the input voltages received by the supervisory logic means of the mobile radiotelephone, thereby periodically initiating an effort to seize an available channel. The channel finding means may have audible or visual channel available signaling means to indicate that the radiotelephone has seized an available channel.

25 Claims, 3 Drawing Figures

MOBILE RADIOTELEPHONE APPARATUS AND METHOD

BACKGROUND OF THE INVENTION

1. Field of the Invention

This invention relates to mobile radiotelephone systems, and, more specifically, it relates to means for automatically obtaining an available channel for placing a call from the mobile radiotelephone unit.

2. Description of the Prior Art

In conventional mobile radiotelephone systems there is a problem in respect of the relatively small number of channels available for use. In order to initiate a call, the mobile radiotelephone unit must obtain an open channel. Channel allocation in such a system is generally controlled by a stationary base computer which selects an open channel as the next one to be employed and announces this selection by broadcasting an idle tone on the chosen channel. The base computer continues to broadcast the idle tone on the selected channel until it receives a request for a channel either from a mobile radiotelephone unit or from a standard telephone attempting to call a mobile radiotelephone unit. When such a request is received, the base computer processes the call and also discontinues its broadcast of the idle tone on a previously selected channel. It then selects another unused channel, if one is available, and begins to broadcast the idle tone on the newly chosen channel.

In the normal situation, when a mobile radiotelephone station is turned on, it begins scanning the channels. Upon finding an available or idle channel, by locating the idle tone, the supervisory logic portion of the mobile radiotelephone inhibits further scanning, thereby leaving the mobile station seized on the idle channel. Due to the relatively small number of channels, frequently, during peak hours, all of the available channels are busy. As there are no unused channels, the base station is not broadcasting the idle tone on any channel. This causes all of the operating mobile radiotelephones in the region to continuously scan all channels searching for the idle tone. If the mobile radiotelephone user lifts the handset to make a call while the supervisory logic is scanning for an idle tone under these circumstances, no call can go through, and the supervisory logic informs the user of this fact by illuminating the busy lamp. The user must then hang up and try again. As a result, in this fashion, the user must repeatedly remove the handset and replace it in order to attempt to obtain an available channel. Not only is such an approach to finding an available channel inefficient, but it is also quite disruptive and annoying for an individual to have to repeatedly remove and replace the handset. This inconvenience is enhanced when the mobile unit is in motion, and the individual is attempting to both drive the vehicle and place the call simultaneously.

Numerous prior art mobile radiotelephone systems have been known. In general, the systems are rather complex involving extensive use of complicated computer logic circuits. See, for example, U.S. Pat. Nos. 3,555,424; 3,634,627; 3,764,915; 3,806,804 and 3,894,194. U.S. Pat. No. 2,803,744 discloses multiple unit mobile radiotelephone systems wherein the possibility of manual selection of channels which are not busy is disclosed as well as the possibility of overriding the manual selection in order to permit reception over an assigned channel. U.S. Pat. No. 3,513,264 relates to satellite communication systems and the central coordination of channel assignment.

There remains, therefore, a substantial need for a practical and economical means for eliminating the need to repeatedly remove a mobile radiotelephone handset and replace the same during the period when all channels are busy in order to determine whether one of the busy channels has become available. There remains a further need to provide such a system which is adapted for use with conventional types of mobile radiotelephone systems. Also, there is the need to provide the user with an indication that an available channel has been obtained without requiring the undesirable and burdensome cyclic removal and replacement of the handset.

SUMMARY OF THE INVENTION

The present invention has solved the above-described problems by providing an economical means of effectively eliminating the need to manually remove and replace a mobile radiotelephone handset from and to its cradle during period of peak telephone use. Electrical means are provided in order to cyclically alter the voltage signal moving from the handset unit to the supervisory logic means of the mobile radiotelephone, in one embodiment. As a result, there is provided means for making a frequent effort to seize an idle channel without requiring handset removal and replacement. In one embodiment, this is accomplished by means of the use of an astable multivibrator in combination with a switching transistor so as to cyclically reduce and raise the voltage present on the hook switch line to the associated supervisory logic means. Associated audible or visual alarm means are provided so as to emit an indication when an idle channel has been received.

It is an object of the present invention to provide channel finding means for mobile radiotelephone systems which will economically and efficiently obtain an idle channel available for placing an outgoing call from the mobile radiotelephone.

It is another object of the present invention to provide such channel finding means and method for using the same wherein the system may readily and easily be installed with conventional mobile radiotelephone equipment presently in use as well as other types.

It is yet another object of the present invention to provide such a channel finder system wherein the efficiency of obtaining an available channel is greatly improved as a result of the high frequency of scanning which may be effected at a speed higher than is possible with the present manual removal and replacement of the handset.

These and other objects of the invention will be more fully understood from the following description of the invention on reference to the illustrations appended hereto.

DESCRIPTION OF THE PREFERRED EMBODIMENTS

Figure 1:
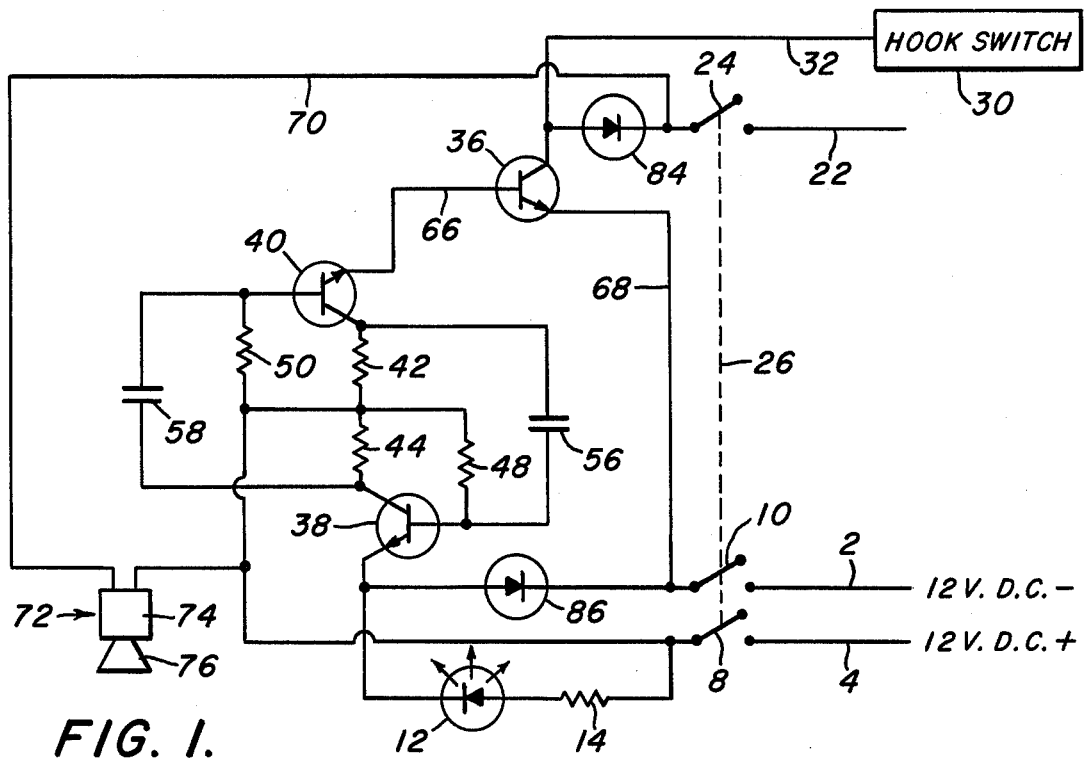
FIG. 1 illustrates a schematic circuit diagram of one form of channel finding means of the present invention.

Referring now to FIG. 1 in greater detail, there is shown a preferred form of channel finding means of the present invention. As is shown, 12 volt DC power is provided to the system by leads 2, 4 (which may conveniently be connected to the radiotelephone) through switch means 8, 10 when the system is energized by closing the switch means 8, 10. Pilot light 12, which is shown in series with resistor 14, is illuminated to provide a visual indication that the unit is on. The pilot light 12 may conveniently be in the form of one or more light emitting diodes. Transmit light driver unit (not shown) is connected to the channel finding means by lead 22 through switch means 24. In the form illustrated and in the preferred embodiment, as is shown by dotted line 26, switch means 8, 10, 24 are preferably tied together such that they will operate simultaneously, such as a triple pole, single throw switch, for example. Hook switch 30, which is the switch associated with the handset and cradle (not shown), is connected to the unit by means of lead 32. Not shown in this view is the lead connecting hook switch 30 to the supervisory logic means of the radiotelephone. The significance of these connections will be discussed hereinbelow.

In normal operation of the radiotelephone of the present system, closing of the switch means 8, 10, 24 results in the channel finding means being energized, and a first voltage which is a relatively high voltage is provided to the supervisory logic means of the radiotelephone over lead 32 through hook switch 30. It will be appreciated that suitable resistance may be provided in lead 32 internally within hook switch 30, externally of hook switch 30 or both. Means are provided in the present invention to interrupt this voltage signal so as to provide a second voltage which is relatively low as compared with the first voltage over lead 32 through hook switch 30 to the supervisory logic means so as to indicate to the supervisory logic means that an available channel for placing an outgoing call from the mobile radiotelephone unit is to be sought.

Figure 2:
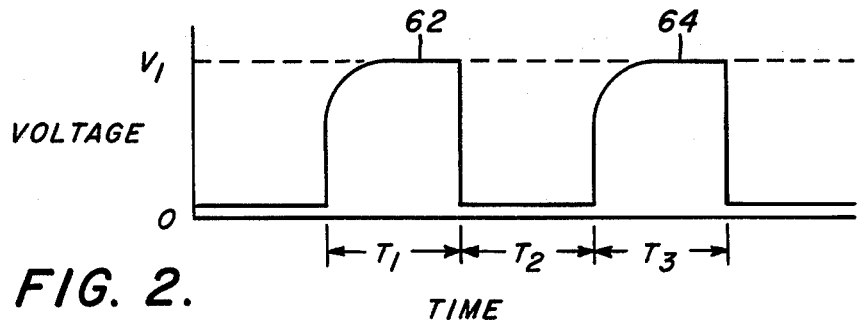
FIG. 2 illustrates a voltage-time plot of a form of output of the multivibrator shown in FIG. 1.

In the preferred form shown in FIG. 1, the means for altering the first voltage signal to the lower second voltage signal in a cyclic fashion is provided in the form of an astable multivibrator which cooperates with switching transistor 36. The astable multivibrator consists of transistors 38, 40, with their associated collector resistors 42, 44 along with the timing resistors 48, 50 and timing capacitors 56, 58. As is shown in FIG. 2, the output of the astable multivibrator will be a square wave signal which, in the form shown, varies in voltage from about 1.4 volts to a peak voltage $V_1$ of about 10.3 volts, for example. The time cycles are shown as indicated by the letters $T_1$, $T_2$, $T_3$, for example. In general, $T_1$ will equal $T_2$, which, in turn, will equal $T_3$, and, as a result, waves 62, 64 will be substantially identical in both voltage peak as well as duration. The square wave signal 62, 64 emerging from astable multivibrator is applied to the base of switching transistor 36 by means of lead 66 and will thereby turn the switching transistor 36 off and on. Assuming that the wave 62 has just been experienced and has turned the switching transistor 36 on for a period $T_1$, during the next cycle of astable multivibrator operation ($T_2$), the switching transistor 36 will be turned off and will be turned on once again upon the square wave signal 64 being applied to the switching transistor 36. When the switching transistor 36 is turned on, the first or high voltage which would normally be present on hook switch line 32 is shorted to ground via lead 68 within switching transistor 36 and therefore a second or low voltage is applied to hook switch lead 32. This low voltage imposed through lead 32 on hook switch 30 is transmitted to supervisory logic means as an attempt by the user to seize an idle channel and initiate a call. If the mobile radiotelephone station is locked on an idle channel, the supervisory logic means signals this by putting out a low voltage signal through transmit light driver line (not shown) which through lead 22 and lead 70 imposes a low voltage across channel available signal means 72 to thereby trigger operation of the same.

In the form shown, the channel available signal means consists of an audio oscillator 74 in operative relationship with a speaker 76, such that a voltage imposed across the channel available signal means 72 will result in an audible alarm indicating to the user that a channel is available for use. The user would then remove the handset from the cradle, thereby opening hook switch 30, open switch 8, 10, 24 and would proceed with the call in the normal fashion.

It will be appreciated that while the preferred form of channel available signal means 72 will provide an audible signal as the user may be in the process of driving a vehicle and will have to keep his eyes on the road, a visual signal, such as a light, which is illuminated by the signal over lead 70, may be provided in lieu of or in addition to the audible channel available signal means 72. In addition to triggering the channel available signal means 72, the low signal from the supervisory logic means transmitted through transmit light driver and lead 22 is also applied through blocking diode 84 and lead 32 to hook switch 30, thereby maintaining the voltage signal at the second or relatively low level regardless of the condition of switching transistor 36 being on or off. This results in maintaining the request for a channel regardless of the switching transistor 36 condition when a channel has been obtained.

The above-described procedure involves the operation of the channel finding means when, in fact, an available channel has been obtained and seized. The situation will now be considered where the cycle of operation does not result in seizure of an available channel.

Referring now, once again, to FIGS. 1 and 2, it will be assumed that during the emission of wave 62, the switching transistor 36 is turned on, thereby reducing the voltage signal on lead 32 and hook switch 30 through the supervisory means to the low level. In the event that the radiotelephone is not locked on an idle tone, the supervisory logic means illuminates the telephone busy signal (not shown). As there is no low voltage signal transferred to the channel finding means through transmit light drive through lead 22 and from there through lead 32 to the hook switch 30 by means of diode 84, the hook switch 30 line voltage is not held in the low position, and it is therefore fully responsive to the condition of switching transistor 36. (Diode 86 serves to maintain transistors 36, 38 at the same voltage.) As a result, the voltage through hook switch 30 is high when the switching transistor 36 is turned off. This condition is interpreted by the supervisory logic means as termination of the user's attempt to initiate a call. The supervisory logic means then turns the busy lamp off. In the context of the FIG. 2 illustration, this period may be likened to the time period $T_2$. After a predetermined time period, the next wave 64 is initiated by the multivibrator, and switching transistor 36 is turned on again to repeat the cycle with the voltage through hook switch 30 being at the low level, thereby initiating another cycle of channel selection.

In order to provide a specific example of how the embodiment shown in FIGS. 1 and 2 might be employed, an illustrative example will be considered. Assuming that a system has a limited number of channels available, such as eleven, for example, and that the base unit is, when vacant channels occur, emitting an idle tone on such channel, at a typical frequency 2000 Hz, the power supply to the channel finding means may be 12 volts DC. Resistors 42, 44 have a resistance of 1500 ohms, and resistors 48, 50, 14 have a resistance of 6800 ohms, while capacitors 56, 58 have a capacitance of 47 microfarads. By using a known formula (T = 0.69RC wherein T is time in seconds, R is the resistance of resistor 48 or 50 in ohms and C is the capacitance in farads) the duration of $T_1$, $T_2$, $T_3$, etc. is found to be approximately 0.22 seconds in the example. See Radio Shack Dictionary of Electronics, Fourth Edition, Second Printing, Tandy Corporation, Fort Worth, Texas, page 39. As a result it will be appreciated that the cyclic scanning will be effected at a very rapid rate. The transistors 36, 38, 40 may conveniently be of the 2N3394 type. Lamp 12 consists of a light emitting diode, and the indicating alarm means may be a suitable audio oscillator. The oscillator marketed under the trademark "Sonalert" is a suitable one for this purpose.

Figure 3:
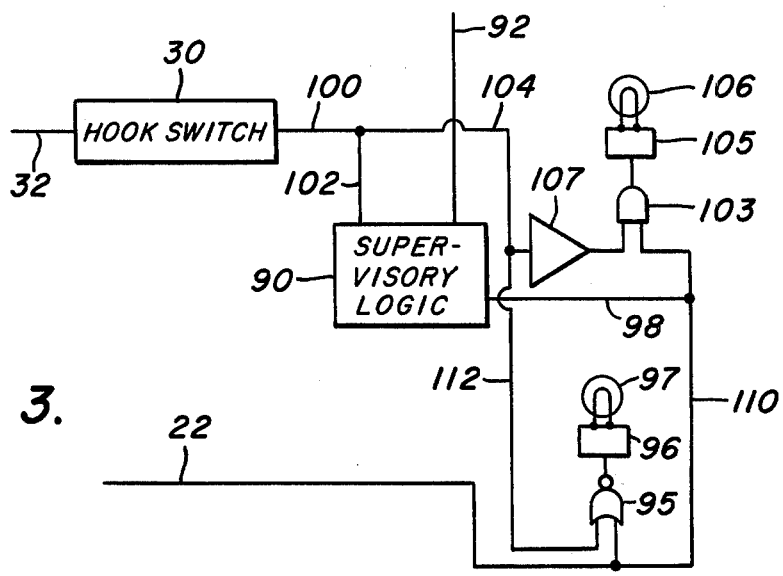
FIG. 3 illustrates a schematic of portions of a form of conventional mobile radiotelephone unit which forms no part of the invention, per se.

Referring now to FIG. 3, there is shown the interrelationship between certain portions of the radiotelephone unit and the channel selecting device. Supervisory logic means 90 is connected with hook switch 30 by means of branch 102 of lead 100. Idle line 92 is also connected with supervisory logic means 90. When the supervisory logic means 90 receives a low voltage signal from the hook switch 30 via leads 100, 102, and simultaneously receives a low voltage over idle line 92 meaning that an idle channel is available, the supervisory logic means 90 emits a low voltage signal over trans key lead 98 which presents the above-described low voltage signal to the channel finding means by means of lead 22. Also, the low voltage signals are applied to transmit light driver 96 through leads 110 and 112 to inclusive NOR gate 95. The transmit light driver 96 serves as a power source for transmit light 97 and amplifies the received low voltage signal. It may be in the form of a transistor. As a result, light 97 will be illuminated to indicate that an available channel has been seized, and the mobile radiotelephone is available for placing an outgoing call. In the event that the low voltage signal is received by supervisory logic means 90 over lead 102, but a low voltage signal corresponding to an available channel is not received over idle line 92, a high voltage signal is emitted over trans key 98 and is transmitted through inverter 107 to busy light 106 via AND gate 103 and busy light driver 105, and busy light 106 is illuminated to indicate that the line is busy. The channel finding means unit would then normally repeat the cycle of channel seeking. The supervisory logic means 90 will, therefore, generally emit a high voltage signal on trans key line 98 unless both the input signal from the hook switch 30 via lead 102, and the input signal from the idle line 92 are both low voltage signals.

It will, therefore, be appreciated that the present invention provides an economical and efficient means of rapidly locating an available channel for placing a call from a mobile radiotelephone unit. The unit may be self-contained compact, and readily connected to a wide variety of conventional and special radiotelephones. The system is adapted for use in conventional types of mobile radiotelephones as well as other types. The burdensome need to physically remove and replace the handset from its cradle is eliminated. In addition, channel selection is effected with increased speed as a result of its being accomplished in electronic fashion as distinguished from a manual physical fashion.

Whereas particular embodiments of the invention have been described above for purposes of illustration, it will be evident to those skilled in the art that numerous variations of the details may be made without departing from the invention as defined in the appended claims.

I claim:

1. A mobile radiotelephone device comprising
   telephone control means for controlling operation of a mobile radiotelephone including supervisory logic means,
   channel finding means for initiating through said supervisory logic means operation of channel seeking action,
   said channel finding means including
      signal generating means for cyclically emitting a signal,
      signal communication means responsive to said signal generating means to cyclically deliver a reduced voltage signal to said supervisory logic means, said supervisory logic means having means for emitting a reduced voltage signal responsive to simultaneous receipt of said reduced voltage signal from said signal communication means and a signal indicating that an idle channel is available,
      channel available means for initiating an audible or visual signal responsive to a signal from said supervisory logic means indicating that an idle channel has been seized,
   whereby said channel finding means will cyclically deliver a reduced voltage signal to said supervisory logic means and thereby provide an indication that an effort to initiate a call is to be made and if said telephone has locked in an available channel said supervisory logic means will emit a low voltage signal to said channel available signal means and said channel finding will have been initiated and completed without the need to remove the telephone handpiece from its cradle.

2. The mobile radiotelephone device of claim 1 including
   said signal generating means in an astable multivibrator.

3. The mobile radiotelephone device of claim 2 including
   said signal communication means including a switching transistor operatively associated with said astable multivibrator and being connected to ground.

4. The mobile radiotelephone device of claim 3 including
   said channel available signal means being an audio oscillator and operatively associated speaker for emitting an audible signal when said radiotelephone has seized an available channel.

5. The mobile radiotelephone device of claim 4 including said audio oscillator emitting an audible signal responsive to a voltage being applied thereto.

6. The mobile radiotelephone device of claim 4 including
first conductor means for providing a first electrical path connecting a first portion of said channel finding means with said supervisory logic means,
second conductor means for providing a second electrical path connecting a second portion of said channel finding means with said supervisory logic means, and
power supply conductor means connecting said channel finding means with said telephone control means.

7. The mobile radiotelephone device of claim 6 including
connecting switch means for simultaneous opening or closing of the connection between said channel selector means and said first conductor means, said second conductor means and said power supply conductor means.

8. The mobile radiotelephone device of claim 6 wherein
said first conductor means includes hook switch means for providing electrical communication between said channel finding means and said supervisory logic means during channel selection and for being further operable responsive to the removal of the telephone handset from its cradle,
whereby said cycle multivibrator signal will responsively turn on said switching transistor to place said first conductor means in a low voltage state which low voltage signal will be passed through said hook switch to said supervisory logic means and provide an indication that an effort to initiate a call is to be made and if said telephone has locked in an available channel, said supervisory logic means will emit a low voltage signal on said second conductor means to said channel available signal means which will emit a responsive signal.

9. The mobile radiotelephone device of claim 8 including
diode means interposed between said second conductor means and said first conductor means to permit passage of the supervisory logic means low voltage signal to said first conducting means thereby maintaining said first conductor means in said low voltage state, whereby seizing of said available channel will maintain said first conductor means in said low voltage state regardless of said cyclic switching transistor being on or off, and if said radiotelephone has not seized an available channel, said supervisory logic means will not emit a low signal through said diode means, and said hook switch means will receive a high voltage signal when said switching transistor goes to an off state, thereby signaling the end of said effort to find a channel until the next said on state of said switching transistor.

10. A mobile radiotelephone device comprising telephone control means including supervisory logic means,
channel finding means for initiating through said supervisory logic means operation of channel seeking action, and
said channel finding means having voltage signal altering means for cyclically altering the voltage passing from said channel finding means to said supervisory logic means between a first level and a second level with one of said levels signaling to said supervisory logic means an effort to seek an idle channel on which to place a call, and the other said level indicating absence of such an effort,
whereby said channel finding means will cyclically deliver a reduced voltage signal to said supervisory logic means and thereby provide an indication that an effort to initiate a call is to be made and if said telephone has locked in an available channel said supervisory logic means will emit a low voltage signal to said channel available signal means and said channel finding will have been initiated and completed without the need to remove the telephone handpiece from its cradle.

11. The mobile radiotelephone device of claim 10 including
said signal altering means including means for cyclically diverting said first or second voltage signal to ground, thereby emitting a low voltage signal to said supervisory logic means to signal an effort to seek an idle channel.

12. The mobile radiotelephone device of claim 11 including
said first voltage level being higher than said second voltage level.

13. The mobile radiotelephone device of claim 10 wherein
said signal altering means includes a switching transistor.

14. The radiotelephone device of claim 13 including
said signal altering means including signal generating means for cyclically emitting a signal.

15. The mobile radiotelephone device of claim 14 including
said signal generating means including an astable multivibrator.

16. The mobile radiotelephone device of claim 15 including
said signal communication means including a switching transistor adapted to be connected to ground in its on state to permit a reduction in the level of voltage passing therethrough as compared with the level of voltage when said switching transistor is in its off state.

17. The mobile radiotelephone device of claim 15 including
said channel finding means including audible or visual indications emitted responsive to a predetermined voltage being applied thereto in order to indicate the presence of a seized available channel in said radiotelephone.

18. A method of obtaining an available channel for placing a call in a mobile radiotelephone having supervisory logic means and a hook switch operatively associated with said supervisory means and operable by physically removing a handset from a cradle wherein the improvement comprises
cyclically electronically reducing the voltage between said hook switch and said supervisory logic means while said handset is disposed in its cradle, and
terminating said cyclic interruption when said radiotelephone seizes an available channel.

19. The method of obtaining an available radiotelephone channel of claim 18 including
emitting an audible or visual indicator signal when a said available channel has been seized.

20. The method of obtaining an available radiotelephone channel of claim 19 including
reducing said voltage by cyclically connecting a circuit portion to ground.

21. The method of obtaining an available radiotelephone channel of claim 19 including
initiating said indicator signal by a low voltage signal from said supervisory logic means.

22. A mobile radiotelephone available channel finder for radiotelephones having supervisory logic portions for coordinating operation of the radiotelephone in conjunction with the hook switch operable by removing a telephone handset from a cradle comprising
channel finder circuit means cooperable with said supervisory logic portion of said radiotelephone,
said channel finder circuit means including first switch means for turning said channel finder on and off,
first conductor means for establishing a first electrical path connecting a first portion of said channel finder to said radiotelephone through the telephone hook switch,
second conductor means for establishing a second electrical path connecting a second portion of said channel finder to said supervisory logic portion,
second switch means for connecting and disconnecting the electrical path established by said second conductor means between said channel finder and said supervisory logic portion,
said channel finder circuit means having voltage signal altering means for cyclically reducing the voltage signal transferred to said telephone hook switch, whereby said supervisory logic portion will interpret said reduced voltage signal as an effort to locate an available channel in order to place an outgoing call, and
said channel finder circuit means including channel seizure indicating means operably responsive to said telephone for signaling seizure of an available channel,
whereby said channel finding means will cyclically deliver a reduced voltage signal to said supervisory logic means and thereby provide an indication that an effort to initiate a call is to be made and if said telephone has locked in an available channel said supervisory logic means will emit a low voltage signal to said channel available signal means and said channel finding will have been initiated and completed without the need to remove the telephone handpiece from its cradle.

23. The mobile radiotelephone available channel finder of claim 22 including
switch coordinating means for operating said first switch means and said second switch means simultaneously.

24. The mobile radiotelephone available channel finder of claim 22 including
said voltage signal altering means including multivibrating means operatively associated with a switching transistor.

25. The mobile radiotelephone available channel finder of claim 24 including
said channel seizure indicating means being an audio oscillator and operatively associated speaker.

* * * * *